United States Patent
Yauger

(10) Patent No.: US 7,524,270 B2
(45) Date of Patent: Apr. 28, 2009

(54) EXERCISE MACHINE

(75) Inventor: Steve Yauger, Richmond, VA (US)

(73) Assignee: Pilr Systems, Inc., Atlanta, GA (US)

( * ) Notice: Subject to any disclaimer, the term of this patent is extended or adjusted under 35 U.S.C. 154(b) by 888 days.

(21) Appl. No.: 10/655,293

(22) Filed: Sep. 5, 2003

(65) Prior Publication Data
US 2004/0132593 A1 Jul. 8, 2004

Related U.S. Application Data

(60) Provisional application No. 60/438,298, filed on Jan. 7, 2003.

(51) Int. Cl.
*A63B 21/00* (2006.01)
(52) U.S. Cl. .................... 482/121; 482/126; 482/74
(58) Field of Classification Search ......... 482/104–108, 482/148, 126, 73, 125, 128; 135/69, 73
See application file for complete search history.

(56) References Cited

U.S. PATENT DOCUMENTS

| | | | | |
|---|---|---|---|---|
| 1,709,501 A | * | 4/1929 | Taylor | ............... 135/73 |
| 3,417,765 A | * | 12/1968 | Slater et al. | ............... 135/69 |
| 3,759,514 A | * | 9/1973 | Cox | ............... 482/126 |
| 4,376,533 A | * | 3/1983 | Kolbel | ............... 482/125 |
| 4,580,778 A | * | 4/1986 | Van Noord | ............... 482/114 |
| 5,046,726 A | * | 9/1991 | Van Straaten | ............... 482/125 |
| 5,071,119 A | | 12/1991 | Johnson | |
| 5,913,756 A | * | 6/1999 | Glaser | ............... 482/128 |

* cited by examiner

*Primary Examiner*—Jerome Donnelly
(74) *Attorney, Agent, or Firm*—McGuireWoods LLP

(57) ABSTRACT

An exercise machine includes a first elongated housing having an endcap at a first end and a hollow interior portion. A second elongated housing is slidably positionable within the first elongated housing. A spring having a progressive resistance force is positioned within an interior portion of the first elongated housing between the endcap and an end of the second elongated housing. The spring is compressible between the endcap and the end of the second elongated housing and provides a progressive in-line resistance to achieve a contractive motion from a semi contracted or hyper extended position from both push and pull positions.

21 Claims, 4 Drawing Sheets

IN-LINE RESISTANCE

TRADITIONAL SUPINE

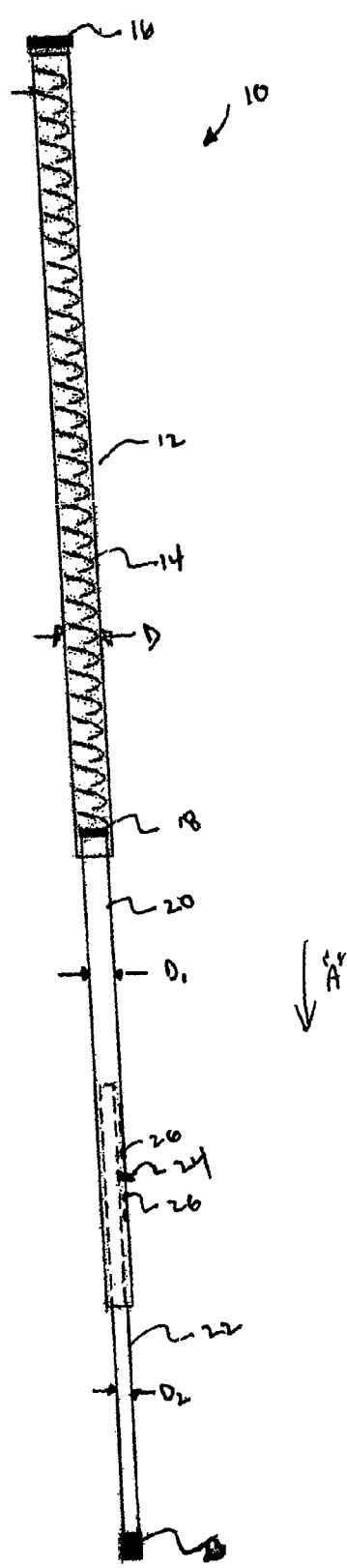
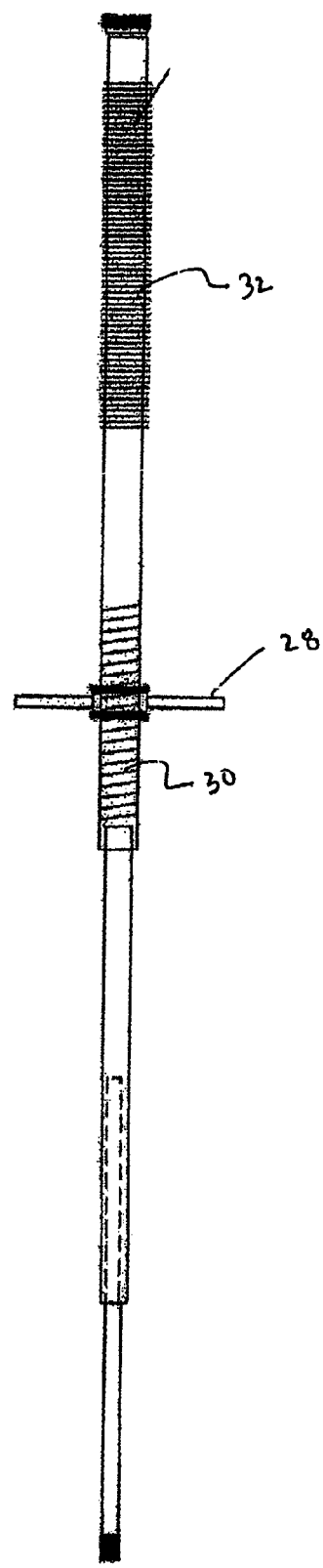
FIGURE 2
FIGURE 3

EXERCISE MACHINE

CROSS REFERENCE TO RELATED APPLICATIONS

This application claims priority to U.S. Provisional Patent Application Ser. No. 60/438,298, filed on Jan. 7, 2003, and which is now incorporated in its entirety herein.

BACKGROUND OF THE INVENTION

1. Field of the Invention

The invention generally relates to an exercise machine and, more particularly, to a progressive in-line resistance exercise machine.

2. Background Description

The strengthening of abdominal and lower back muscles as well as other muscle or muscle groups are important to one's posture and overall health. To strengthen one's abdominal muscles, several types of exercises and exercise machines are available and known. One type of exercise is a conventional sit-up. However, in a conventional sit-up there is a considerable amount of lower back stress and a lack of head and neck support throughout the sit-up motion.

By way of example, FIG. 1 is a highly schematic representation of a conventional sit-up. In this representation, (a) represents the fulcrum point (lower back of a user), (b) represents the user, (c) represents the applied load, (d) represents the force and (e) represents a motion by the user (b). As can be seen, the force component (d) and the load component (c) are perpendicular to one another. This results in a pressure at the fulcrum point (a), which adds undue stress to the user's back. Also, with the motion of the sit-up, at about 58% of the full range of motion, the user uses less concentric contraction force as they are isometric contraction; to support a bodyweight against gravity. Thus, the user is performing a very ineffective isometric contraction at this point. Additionally, during the motion of the sit-up, especially during the initial stages of the sit-up, the head, neck and lower back are not supported against the load, i.e., gravity, very effectively. This may result in injury or undue strain placed on the neck and lower back, in the least.

Exercise machines have been designed to overcome some of these shortcomings of a conventional sit-up. For example, weight machines have been devised to assist the user in strengthening the abdominal muscles and back muscles while supporting the head and neck. However, weight machines are not portable, and are typically very expensive to purchase. Additionally, these known weight machines, which use pulley systems, do not provide a full range of progressive resistance for the full range of motion of the exercise.

Other exercise machines are portable such as, for example, an abdominal roller machine. These machines require the user to lie on the floor during the exercise. These machines do not provide a progressive resistance during the full range of motion of the sit-up and actually restrict the beginning point of exercise and, some of the same stressful forces and loads as with the conventional sit-up are still applied to the user. Thus, these machines do not make the sit-up more effective than that of a conventional sit-up.

The invention is directed to overcoming one or more of the problems as set forth above.

SUMMARY OF THE INVENTION

In a first aspect, an exercise machine includes a first elongated housing having an endcap at a first end and a hollow interior portion. A second elongated housing is slidably positionable within the first elongated housing. A spring having a progressive resistance force is positioned within an interior portion of the first elongated housing between the endcap and an end of the second elongated housing. The spring is compressible between the endcap and the end of the second elongated housing and providing a progressive in-line resistance to achieve a contractive motion from a semi contracted or hyper extended position from both push and pull positions.

In another aspect of the invention, a portable exercise device includes an outer housing, an endcap positioned at a first end of the outer housing and an inner housing telescopically fitting with the outer housing. A compression spring is placed within the outer housing and confined between the endcap and an end of the inner housing. A height adjusting mechanism is adjustably mounted to the inner housing.

In yet another aspect of the invention, a portable exercise machine includes a mechanism for providing an in-line progressive resistive force to perform a progressively resistant stand-up sit-up or abdominal exercise from a standing position with a full concentric contraction of the abdominus erectus and a full concentric contraction of the oblique muscles and a mechanism for housing the in-line progressive resistive force means. A mechanism is also included to adjust a height of the housing.

BRIEF DESCRIPTION OF THE DRAWINGS

The foregoing and other objects, aspects and advantages will be better understood from the following detailed description of a preferred embodiment of the invention with reference to the drawings, in which:

FIG. 2 shows an embodiment of the exercise machine of the invention;

FIG. 3 shows an embodiment of the exercise machine of the invention;

DETAILED DESCRIPTION OF EMBODIMENTS OF THE INVENTION

Figure 6:
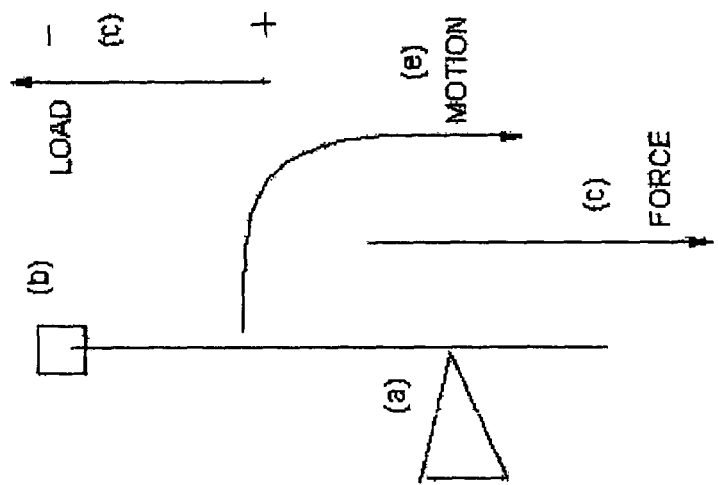
FIG. 6 shows forces and loads associated with the use of the invention.
Figure 1:
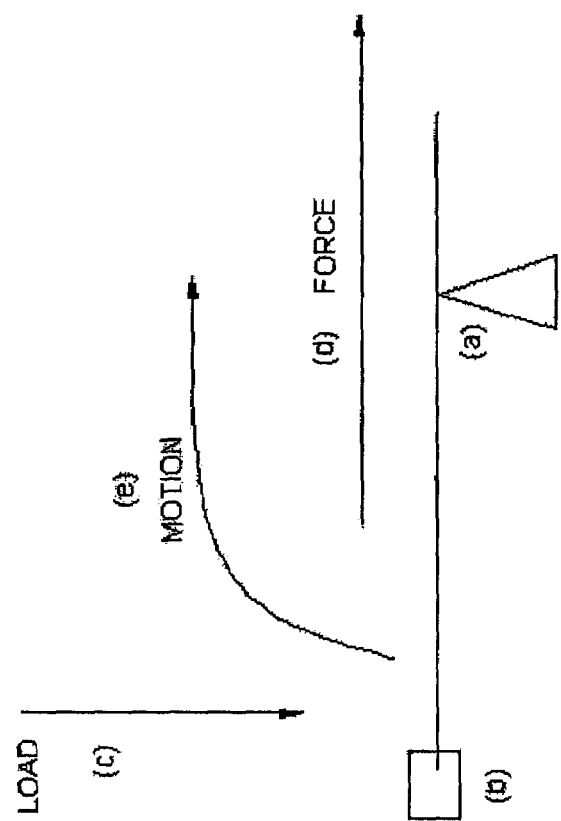
FIG. 1 shows a general schematic diagram of a conventional sit-up.

The invention is directed to an exercise machine and more particularly to a progressive in-line resistance exercise machine used to strengthen any muscle or group of muscles engaged in an effort to compress the device, in one case, strengthen abdominal and lower back muscles In an aspect of the invention, the exercise machine allows a user to perform a progressively in-line resistant stand-up sit-up or abdominal exercise from a standing position with a portable device that allows a full concentric contraction of the abdominus erectus and a full concentric contraction of the oblique muscles. The exercise machine also allows concentric contraction of the lower back muscles to be achieved. The exercise machine further allows for a longer range of motion exercise than traditional supine sit-ups while offering optional methods of efficient use to eliminate "cheating" and/or help the user unable to isolate muscle contractions.

This exercise machine of the invention also offers a new option of portable exercise that allows users having body types and exercise limitations, i.e., obese conditions or aged conditions or conditions brought on by various stages of rehabilitation, to perform needed core muscle conditioning to satisfy medical conditions related to unbalanced or atrophied core muscle conditions. Also, by utilizing a non-supine position as presented by the invention, the user gains the benefit of avoiding a perpendicular force by using an in-line resistance thus improving upon current devices that require:
 (i) the user to either sit in a chair,
 (ii) press a device into or onto themselves to achieve resistance,
 (iii) place a resistive device with cross member in direct proximity of or in direct line of fire with the head and neck,
 (iv) lie prone, or supine
 (v) stress the neck and lower back,
 (vi) perform only isometric contractions of some abdominal muscles, and
 (vii) limit themselves to conditioning limited groups of muscles with the same device and be limited to a particular resistive force.
 (viii) limit themselves to exercises that are to be preformed in a sitting position thus restricting the users ability to apply force to a compressive action.
 (ix) expose themselves to projectiles caused by the possible failure during stress of many un-contained resistive devices such as rubber or other tubing used in many exercises.

Exercise Machine

Now referring to FIG. 2, an embodiment of the exercise machine is shown. The exercise machine is generally depicted as reference numeral 10 and includes, in one embodiment, an outermost spring housing 12 having a diameter or cross section "D". A compression spring 14 is positioned within the housing 12 and has a spring force depending on the application of use. For example, the spring may have a force specifically designed to attain a needed deflection for a proper range of motion for each individual user such as, for example, a spring force of ten. It is contemplated that the spring have a progressive resistance force such that, for example,
 (i) when 10 pounds of force is applied, the spring will move one inch,
 (ii) when 20 pounds of force is applied, the spring will move two inches, and
 (iii) when 100 pounds of force is applied, the spring will move 10 inches, etc.

Still referring to FIG. 2, the spring 14 is positioned between a removable spring retention cap 16 positioned at an upper end of the housing 12 and a plunger cap 18 positioned on an upper end of an inner member 20 which telescopes within the housing 12. The inner member 20 has a diameter or cross section $D_1$ smaller than the diameter or cross section D of the housing 12 such that the inner member 20 is capable of a sliding motion within the housing 12.

The removable spring retention cap 16 may be color, numerically or otherwise coded to signify the compression force of each interchangeable spring placed within the housing 12. The spring 14 may also be interchangeable with other springs allowing for multiple muscles and muscle types to be worked by simply removing the removable spring retention cap 16. Due to the confinement of the spring between the respective caps 16 and 18, a compressive force applied to the housing 18, will result in a compression of the spring 14 thus providing a progressive resistance.

A height adjustment member 22 having a diameter or cross section $D_2$ is positioned within the inner member 20. The diameter or cross section $D_2$ is smaller than the diameter or cross section $D_1$ of the inner member 20 thus allowing the height adjustment member 22 to telescope or move within the inner member 20. A skid resistance foot 23 is positioned at a bottom end of the height adjustment member 22. A cotterless spring loaded hitch pin 24 communicates with holes 26 positioned at various heights on the inner member 20 in order to provide an adjustment mechanism to the exercise machine of the invention. A compression fitting well known in the art having a compression flange and a screw mechanism may also be used with the height adjustment member of the invention.

FIG. 3 shows an embodiment of the invention. In this embodiment, a removable handgrip 28 may be provided on the housing 12. The handgrip 28 may be rotated via a threaded mechanism 30 on the housing 12 and the handgrip 28. The housing 12 may also include a grip 32, such as a rubber material, on the exterior of the housing 12 for a user to grip during the motions of the exercise machine. A knurling may also be present on the exterior of the housing 12. The handgrip may also include a rubber or other type of material, or equally may include the knurling.

Figure 4:
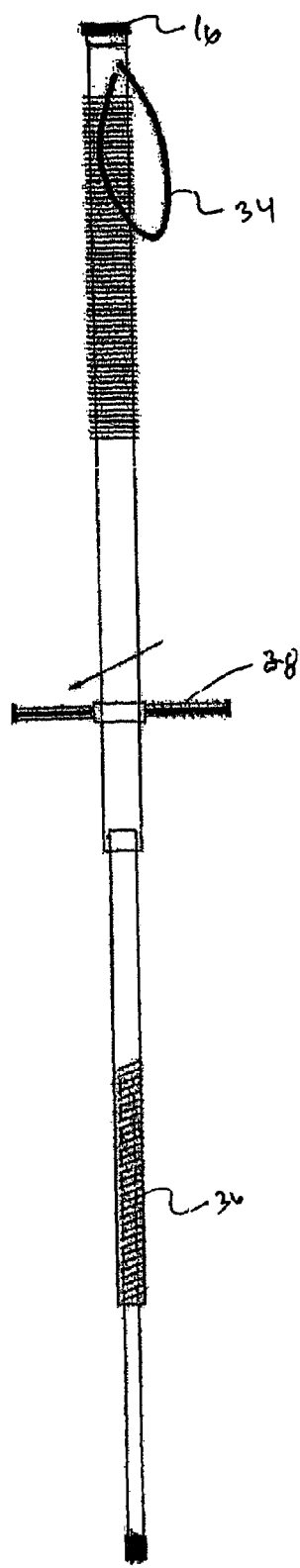
FIG. 4 shows an embodiment of the exercise machine of the invention.

FIG. 4 shows another embodiment of the invention. In this embodiment, it is shown that the handgrip 28 may be bolted or otherwise fastened onto the housing 12. In either scenario, the handgrip 28 may be removable. The embodiment of FIG. 4 further shows strap(s) 34 may be used by a novice user for gripping the exercise machine during the exercise motions. This may be accomplished by placing the user's arms through the respective strap(s) such that the user's underarms are now supported within the strap(s). The embodiment of FIG. 4 further shows a screw-type mechanism 36 for adjusting the height adjustment member 22 with respect to the inner member 20.

Figure 5:
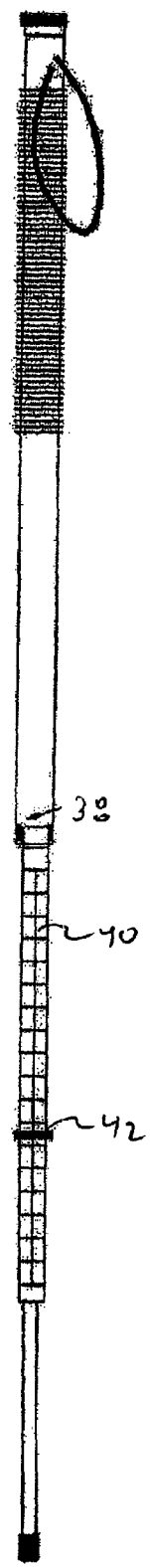
FIG. 5 shows an embodiment of the exercise machine of the invention.

FIG. 5 shows another embodiment of the invention. In this embodiment, the inner member 20 slides within the housing 12 via a bushing 38. This allows for a smooth telescoping or sliding motion between the inner member 20 and the housing 12. The inner member 20 also includes a calibrated scale 40 to indicate the achieved range of motion and achieved level of compression. A movable compression achievement indicator 42 is also provided.

It should be understood by those of ordinary skill in the art that the many features discussed in FIGS. 2-5 are interchangeable with one another. For example, the scale shown in FIG. 5 may be placed on the exercise machine of FIG. 2. This is applicable for other features, as well, such as the handgrip of either FIG. 3 or 4 being placed on the embodiment of FIGS. 2 and 5. Thus, the features shown in each of the embodiments should not be limited to any one of the embodiments and, as one of ordinary skill in the art can readily appreciate, can be interchanged accordingly. In embodiments, the members or housings 12, 20 and 22 may have any cross section such as circular square, octagonal or the like. It is also contemplated that the need for the height adjustment member 22 may not be needed in certain applications of the invention.

FIG. 6 shows the advantages of using the invention. In this representation, (a) represents the fulcrum point (lower back of a user), (b) represents the user, (c) represents the applied load, (d) represents the force and (e) represents a motion by the user (b). In the invention, compared to a conventional sit-up, for example, the exercise machine of the invention will have a load which is inline with the force. Now, since the user is in the standing position, almost all concern for head and neck support is removed in addition, there is a significant reduction in lower back stress. Also, the effective range of motion is greatly increased since there is a progressive inline resistance the further the user pushes the machine through the downward motion as shown by arrow "A" in FIG. 2. It is should now be understood that as the abdominal muscles become more effective in the aiding of support through the contraction, the resistance of the exercise machine is also increased to maximize workload safety in conjunction with abdominal muscle support.

Methods of Use

Figures 7, 8:
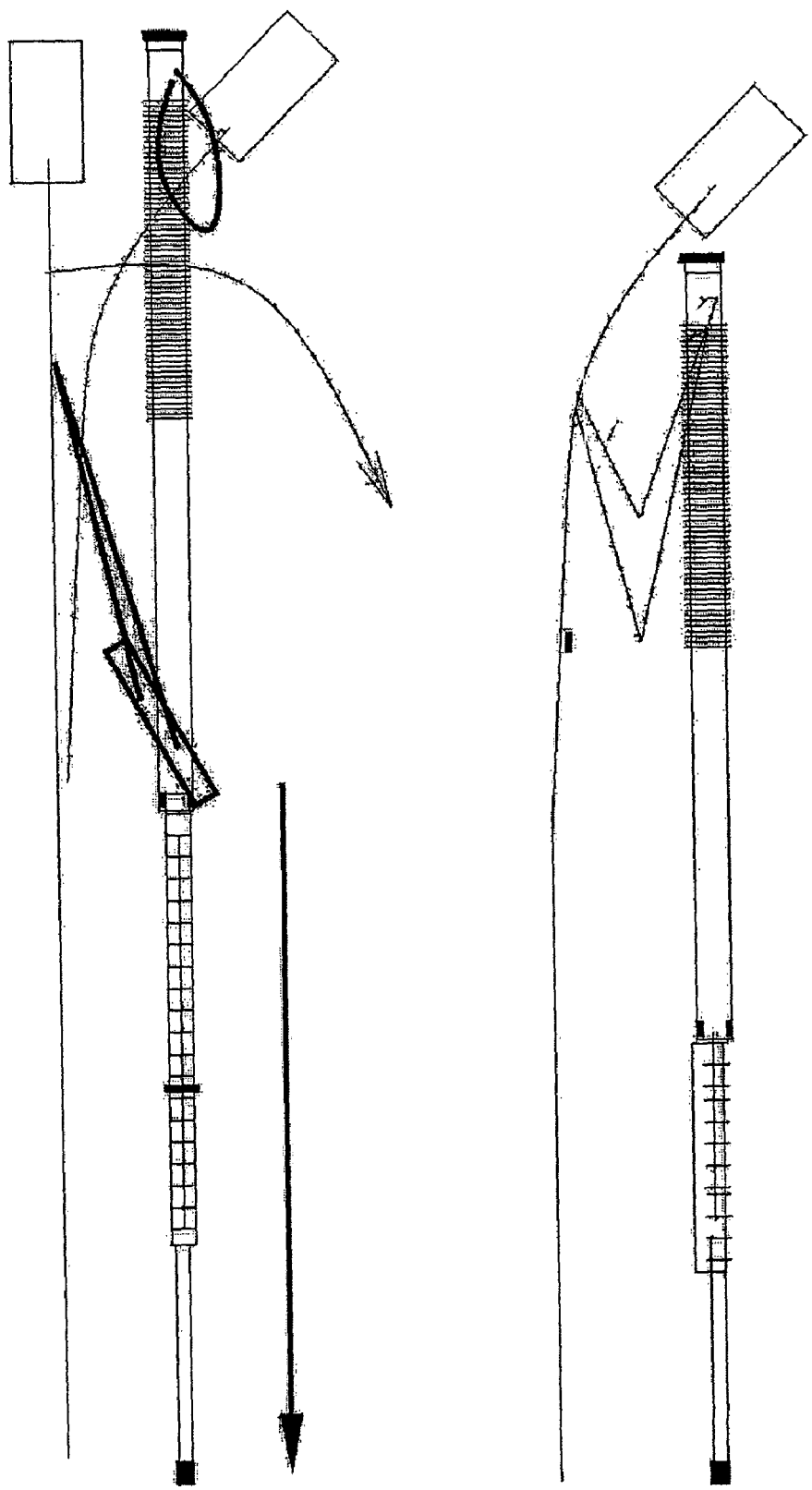
FIG. 7 shows the exercise machine in use in accordance with an application of the invention.
FIG. 8 shows the exercise machine in use in accordance with an application of the invention.

As show in FIGS. 7 and 8, from a standing position the user has an option of either pulling or pushing down against a progressive in-line resistance to achieve contraction. Using the various height adjustments, the user can begin a contractive motion from a semi contracted or hyper extended position from both push or pull positions. With arm movement limited by either a downward-locked position or a fully extended position above the head, the user can perform an abdominal contraction and isolate the abdominal muscles by trying to move a point represented by the fronts of the shoulders towards the feet and ground in the most direct path achievable.

To achieve a concentric contraction of the oblique muscles, the foot of the device is placed behind (or to the side) and away from the user. While keeping the hands on the top of the device, the user pushes the top of the device towards the foot of the device. During this compression, the users shoulder should move around and downward via a trunk rotation towards the opposite hip joint.

While these are two intended motions, various resistive exercises can be performed by either pushing or pulling the device in line with a contraction of any muscle set or in accordance with moving an end of a bone towards its intended destination via a lever action.

While the invention has been described in terms of embodiments, those skilled in the art will recognize that the invention can be practiced with modification within the spirit and scope of the appended claims.

I claim:

1. An exercise machine, comprising:
   a first elongated housing having an endcap at a first end and a hollow interior portion and a gripping material applied directly to the outer surface of the first elongated housing;
   a second elongated housing slidably positionable within the first elongated housing and includes a calibrated scale to indicate achieved range of motion and achieved level of compression and a movable compression achievement indicator associated with the calibrated scale;
   a height adjustment mechanism positioned within the second elongated housing; and
   a spring having a progressive resistance force positioned within the hollow interior portion of the first elongated housing between the endcap and an end of the second elongated housing, the spring being compressible between the endcap and the end of the second elongated housing and providing a progressive in-line resistance to achieve a contractive motion from a semi contracted or hyper extended position from both push and pull positions.

2. The exercise machine of claim 1, wherein the first and second elongated housings allow a full concentric contraction of abdominus erectus and a full concentric contraction of oblique muscles and other muscle or group of muscles engaged to compress.

3. The exercise machine of claim 1, wherein the first elongated housing has a cross section which is larger than a cross section of the second elongated housing.

4. The exercise machine of claim 1, further comprising a plunger cap positioned on the upper end of the second elongated housing.

5. The exercise machine of claim 1, wherein the endcap is removable in order to change the spring.

6. The exercise machine of claim 1, wherein the endcap is coded to signify a compression force of the spring placed within the interior of the first elongated housing.

7. The exercise machine of claim 1, wherein the height adjustment mechanism is one of (i) threadably fitted to the second elongated housing, (ii) pressure fitted to the second elongated housing and (iii) fitted to the second elongated housing using a cotterless spring loaded hitch pin communicating with holes positioned at various heights on the second elongated housing.

8. The exercise machine of claim 1, further comprising a removable and rotatable handgrip provided on the first elongated housing.

9. The exercise machine of claim 8, wherein the handgrip is removably mounted on the first elongated housing via a threaded or compression or pin retained mechanism.

10. The exercise machine of claim 1, further comprising straps positioned near the endcap on the first elongated housing.

11. The exercise machine of claim 1, wherein the second elongated housing includes a calibrated scale to indicate an achieved range of motion and achieved level of compression.

12. The exercise machine of claim 11, further comprising a movable compression achievement indicator associated with the calibrated scale.

13. The exercise machine of claim 1, wherein an applied load is in-line and progressively resistant with a generated force to reduce a need for neck and back support in abdominal and other muscle work.

14. A portable exercise device, comprising:
    an outer housing;
    an endcap positioned at a first end of the outer housing;
    an inner housing telescopically fitting with the outer housing, wherein the inner housing includes a calibrated scale to indicate an achieved range of motion and achieved level of compression and a movable compression achievement indicator associated with the calibrated scale;
    a compression spring placed within the outer housing and confined between the endcap and an end of the inner housing; and
    a height adjusting mechanism adjustably mounted to the inner housing.

15. The portable exercise device of claim 14, wherein the outer and inner housings allow a full concentric contraction of abdominus erectus and a full concentric contraction of oblique muscles and other muscle or group of muscles engaged to compress.

16. The portable exercise device of claim 14, wherein the endcap is removable in order to change the spring.

17. The portable exercise device of claim 16, wherein the endcap is coded to signify a compression force of the spring placed within the interior of the first elongated housing.

18. The portable exercise device of claim 14, wherein the height adjustment mechanism is one of (i) screw fit, (ii) pressure fit and (iii) a cotterless spring loaded hitch pin communicating with holes positioned at various heights on the inner housing.

19. The portable exercise device of claim 14, further comprising a removable handgrip mounted on the outer housing.

20. The portable exercise device of claim 14, further comprising straps mounted on the outer housing.

21. The exercise machine of claim 1, wherein the endcap is numerically coded to signify a compression force of the spring placed within the interior of the first elongated housing.

* * * * *